(12) United States Patent
Yamaguchi

(10) Patent No.: US 12,191,193 B2
(45) Date of Patent: Jan. 7, 2025

(54) METHOD OF MANUFACTURING SEMICONDUCTOR DEVICE AND FILM FORMING APPARATUS

(71) Applicant: Tokyo Electron Limited, Tokyo (JP)

(72) Inventor: Tatsuya Yamaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 409 days.

(21) Appl. No.: 17/444,775

(22) Filed: Aug. 10, 2021

(65) Prior Publication Data

US 2022/0059396 A1  Feb. 24, 2022

(30) Foreign Application Priority Data

Aug. 20, 2020  (JP) .................. 2020-139562

(51) Int. Cl.
| | |
|---|---|
| *H01L 21/764* | (2006.01) |
| *C23C 16/44* | (2006.01) |
| *C23C 16/455* | (2006.01) |
| *C23C 16/48* | (2006.01) |
| *H01J 37/32* | (2006.01) |
| *H01L 21/02* | (2006.01) |

(52) U.S. Cl.
CPC ........ *H01L 21/764* (2013.01); *C23C 16/4412* (2013.01); *C23C 16/45557* (2013.01); *C23C 16/482* (2013.01); *H01J 37/32522* (2013.01); *H01J 37/32834* (2013.01); *H01J 2237/3321* (2013.01); *H01L 21/022* (2013.01)

(58) Field of Classification Search
CPC ..................... H01L 21/7682; H01L 21/76865
See application file for complete search history.

(56) References Cited

U.S. PATENT DOCUMENTS

| | | | |
|---|---|---|---|
| 2016/0272814 A1* | 9/2016 | Sano | .................. C08L 81/04 |
| 2017/0033004 A1* | 2/2017 | Siew | .............. H01L 21/76834 |
| 2019/0218425 A1* | 7/2019 | Schwartz | ............... B32B 9/005 |
| 2019/0221650 A1* | 7/2019 | Zang | .............. H01L 21/76897 |
| 2020/0395244 A1* | 12/2020 | Lee | .................. H01L 21/7682 |

FOREIGN PATENT DOCUMENTS

| | | |
|---|---|---|
| JP | 2012-054307 A | 3/2012 |
| JP | 2015-229776 A | 12/2015 |
| JP | 2019-106490 A | 6/2019 |
| JP | 2020-080397 A | 5/2020 |

* cited by examiner

*Primary Examiner* — Edward Chin
(74) *Attorney, Agent, or Firm* — Armstrong Teasdale LLP

(57) ABSTRACT

A method of manufacturing a semiconductor includes adjusting a temperature of a substrate having a recess formed therein and accommodated in a container to a temperature within a range of 200 degrees C. or higher and 280 degrees or lower, and laminating a polyurea film in the recess in the substrate by supplying isocyanate gas and amine gas into the container.

9 Claims, 9 Drawing Sheets

METHOD OF MANUFACTURING SEMICONDUCTOR DEVICE AND FILM FORMING APPARATUS

CROSS-REFERENCE TO RELATED APPLICATION

This application is based upon and claims the benefit of priority from Japanese Patent Application No. 2020-139562, filed on Aug. 20, 2020, the entire contents of which are incorporated herein by reference.

TECHNICAL FIELD

Various aspects and embodiments of the present disclosure relate to a method of manufacturing a semiconductor device and a film forming apparatus.

BACKGROUND

For example, Patent Document 1 below discloses a technique for reducing the relative dielectric constant of an interlayer insulating film by forming an air gap in the interlayer insulating film in a semiconductor device having a multilayer structure. In this technique, when an interlayer insulating film is embedded in a recess in a substrate, a space (void) that causes an embedding failure is formed in the recess, and the formed void is used as an air gap.

PRIOR ART DOCUMENT

[Patent Document]
Patent Document 1: Japanese Laid-Open Patent Publication No. 2012-54307

SUMMARY

According to embodiments of the present disclosure, there is provided a method of manufacturing a semiconductor includes adjusting a temperature of a substrate having a recess formed therein and accommodated in a container to a temperature within a range of 200 degrees C. or higher and 280 degrees or lower, and laminating a polyurea film in the recess in the substrate by supplying isocyanate gas and amine gas into the container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
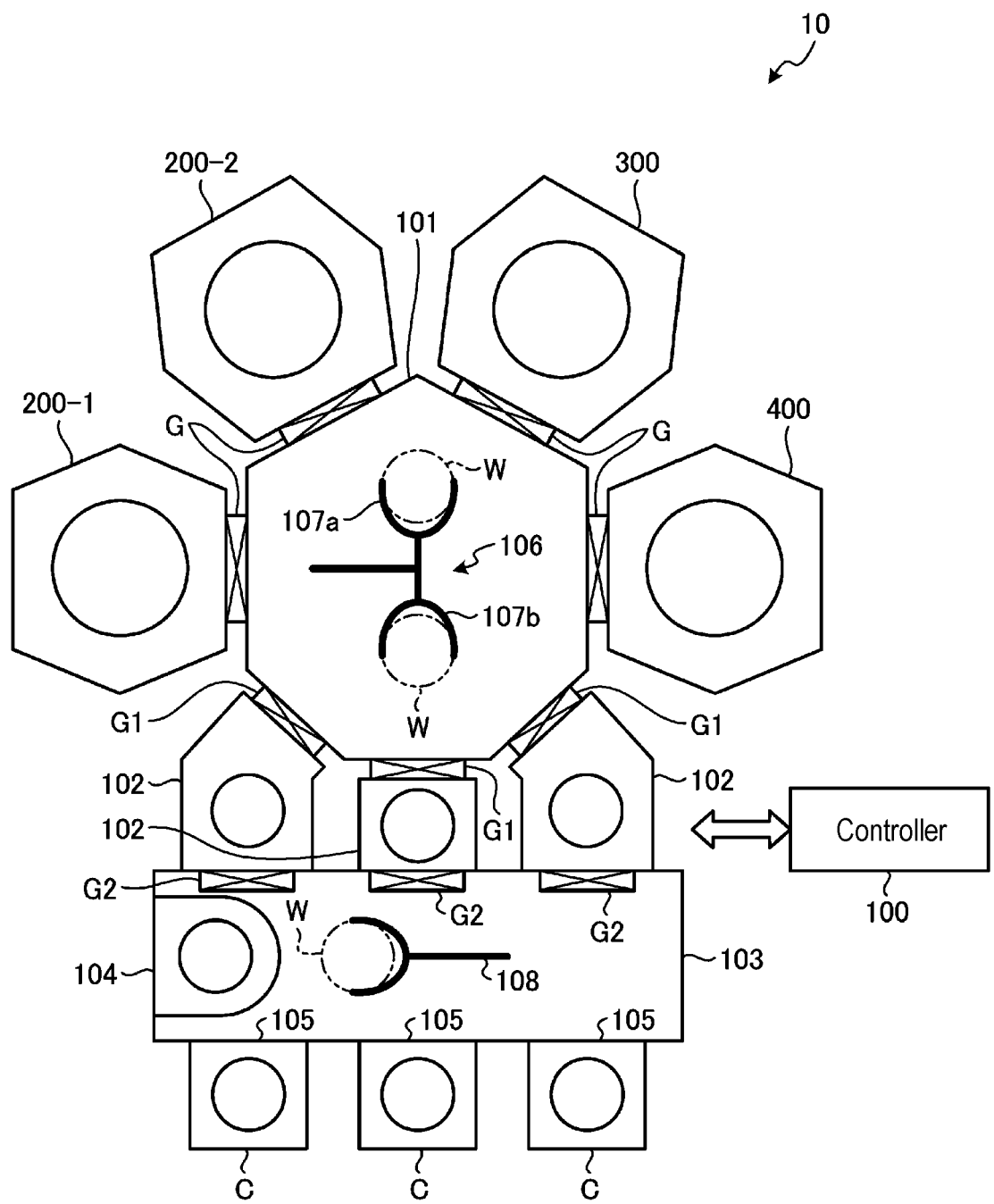
FIG. 1 is a view illustrating the configuration of an exemplary manufacturing system according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a method of manufacturing a semiconductor device and a film forming apparatus disclosed herein will be described in detail with reference to the drawings. The following embodiments do not limit a method of manufacturing a semiconductor device and a film forming apparatus disclosed herein.

The shape and size of a void formed as the result of embedding failure depend on, for example, the width or depth of a recess. For example, when the width of the recess is narrow, a large void is formed in the lower portion of the recess, but when the width of the recess is wide, almost no voids may be formed in the lower portion of the recess. In addition, the shape and size of the void formed in a recess may vary depending on the position of the recess on the substrate and the position of the recess in a semiconductor-manufacturing apparatus. Therefore, it is difficult to form a void having a desired shape and size in a recess having an arbitrary shape.

Therefore, it is conceivable that a thermally decomposable organic material is laminated on a substrate having a recess, the organic material around the recess is removed, a sealing film is laminated on the organic material in the recess, and then the substrate is heated to cause the thermally decomposable organic material to be desorbed from the recess through the sealing film. This makes it possible to form an air gap having a shape corresponding to the shape of the organic material between the recess and the sealing film.

Here, on the substrate, an air gap is required in order to reduce parasitic capacitance between wires in a location in which a wiring interval of, for example signal lines or ground lines is narrow. However, in such a location, the ratio of height to width of the air gap increases. Therefore, the mechanical strength of a structure in which an air gap is formed is not so low.

Meanwhile, in a location in which a wiring interval is wide, when an air gap is formed, the ratio of height to width of the air gap decreases. Thus, the mechanical strength of the structure in which the air gap is formed becomes lower than that in the air gap formed where the wiring interval is narrow. Actually, in a place in which the wiring interval is wide, it is often possible to reduce the parasitic capacitance between wiring lines, e.g., by interposing a dielectric film between the wiring lines even when an air gap is not provided between the wiring lines. As described above, it may not be preferable to form an air gap, depending on the width of a recess.

In addition, in the process of processing a semiconductor device, in order to process a location having a wide wiring interval, a protective film may be formed in a location having a narrow wiring interval. In such a case, it is conceivable that the protective film is laminated as a whole and selectively removed from the location in which the wiring interval is wide. However, when it is possible to suppress the amount of the protective film formed in the location in which the wiring interval is wide, it is possible to suppress the wasteful consumption of material gas for forming the protective film.

Therefore, the present disclosure provides a technique capable of selectively forming a film in a recess having a narrow width rather than in a recess having a wide width.

[Configuration of Manufacturing System 10]

FIG. 1 is a view illustrating the configuration of an exemplary manufacturing system 10 according to an embodiment of the present disclosure. The manufacturing system 10 includes a film forming apparatus 200-1, a film forming apparatus 200-2, a plasma processing apparatus 300, and a heating apparatus 400. The manufacturing system 10 in the present disclosure is a multi-chamber-type vacuum processing system. The manufacturing system 10 forms an air gap in a substrate W in which an element used in a semiconductor device is formed using the film forming apparatus 200-1, the film forming apparatus 200-2, the plasma processing apparatus 300, and the heating apparatus 400. The film forming apparatus 200-1 and the film forming apparatus 200-2 have the same configuration. Hereinbelow, the film forming apparatus 200-1 and the film forming apparatus 200-2 may be collectively referred to as a "film forming apparatus 200" without distinguishing each of the film forming apparatuses.

The film forming apparatus 200 accommodates, in a container, a substrate W having a recess formed therein, and laminates a thermally decomposable organic material on the surface of the substrate W by supplying material gases into the container in the state in which the substrate W is heated to a predetermined temperature. In the present embodiment, the predetermined temperature is, for example, a temperature within the range of 200 degrees C. or higher and 280 degrees C. or lower. Preferably, the predetermined temperature may be, for example, a temperature within the range of 220 degrees C. or higher and 250 degrees or lower. In the present embodiment, the material gases are, for example, isocyanate gas and amine gas. In the present embodiment, the thermally decomposable organic material is a polyurea film formed through polymerization of isocyanate and amine.

The plasma processing apparatus 300 laminates a sealing film on the organic material formed in the recess in the substrate W using microwave plasma. The heating apparatus 400 heats the substrate W to a second temperature higher than a first temperature to thermally decompose the organic material under the sealing film, and desorbs the organic material under the sealing film through the sealing film. As a result, an air gap is formed between the sealing film and the recess.

The film forming apparatus 200-1, the film forming apparatus 200-2, the plasma processing apparatus 300, and the heating apparatus 400 are connected to four side walls of a vacuum transport chamber 101 having a heptagonal planar shape via gate valves G, respectively. Three load-lock chambers 102 are connected to the other three side walls of the vacuum transport chamber 101 via respective gate valves G1. The three load-lock chambers 102 are connected to the atmospheric transport chamber 103 via respective gate valves G2.

The inside of the vacuum transport chamber 101 is evacuated by a vacuum pump, and is maintained at a predetermined degree of vacuum. In the vacuum transport chamber 101, a transport mechanism 106, such as a robot arm, is provided. The transport mechanism 106 transports substrates W between the film forming apparatus 200-1, the film forming apparatus 200-2, the plasma processing apparatus 300, the heating apparatus 400, and respective load-lock chambers 102. The transport mechanism 106 has two arms 107a and 107b, which are independently movable.

A side surface of the atmospheric transport chamber 103 is provided with a plurality of ports 105, in each of which a carrier (e.g., a front-opening unified pod (FOUP)) C for accommodating substrates W is mounted. In addition, on a side wall of the atmospheric transport chamber 103, an alignment chamber 104 is provided so as to perform alignment of the substrates W. A downflow of clean air is formed in the atmospheric transport chamber 103.

A transport mechanism 108, such as a robot arm, is provided in the atmospheric transport chamber 103. The transport mechanism 108 transports substrates W between each carrier C, each load-lock chamber 102, and the alignment chamber 104.

A controller 100 has a memory, a processor, and an input/output interface. The memory stores, for example, a program executed by the processor and a recipe including conditions for each process. The processor executes a program read from the memory and controls each part of the manufacturing system 10 via the input/output interface on the basis of a recipe stored in the memory.

[Configuration of Film Forming Apparatus 200]

Figure 2:
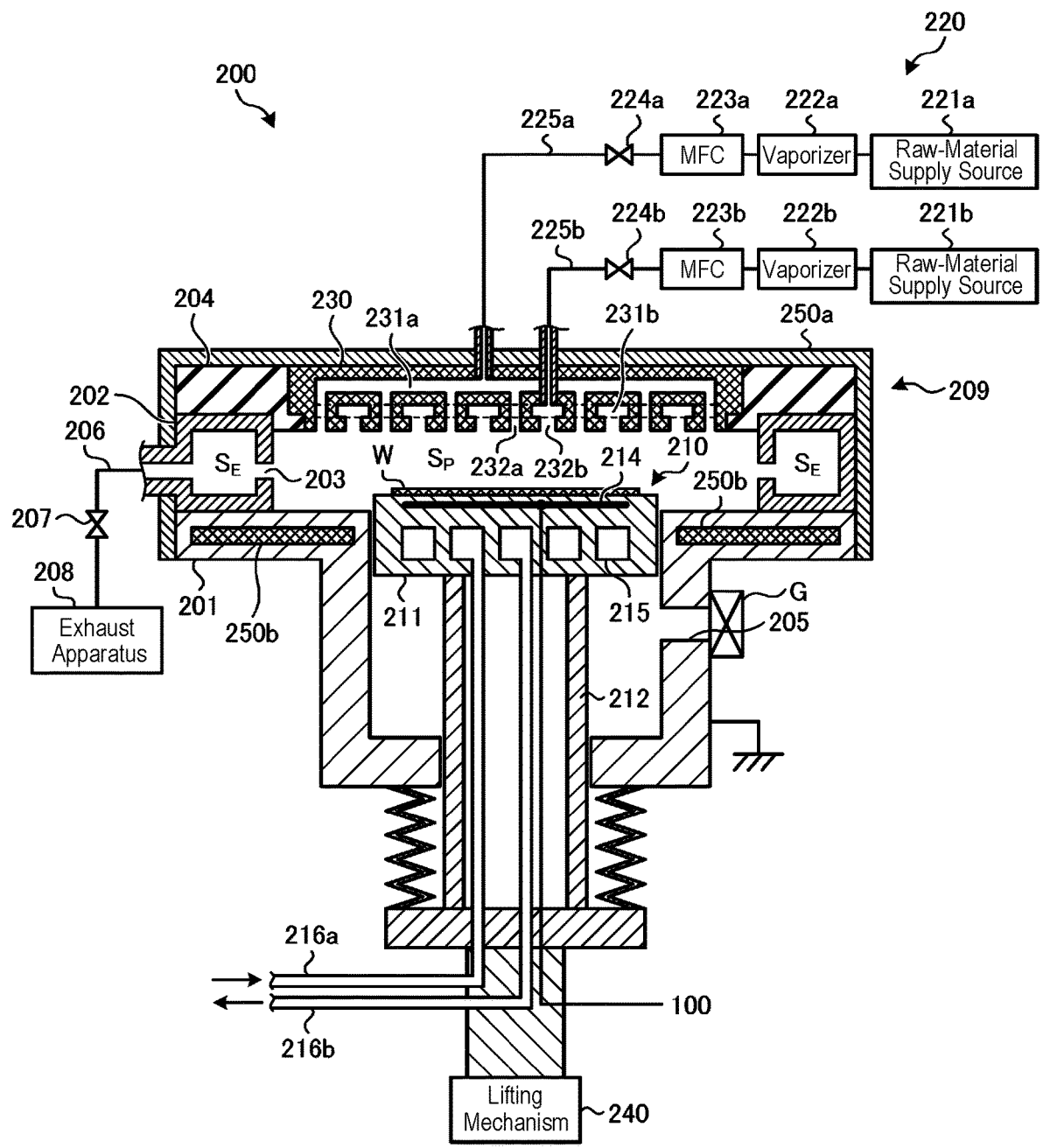
FIG. 2 is a schematic view illustrating an exemplary film forming apparatus according to an embodiment of the present disclosure.

FIG. 2 is a schematic view illustrating an exemplary film forming apparatus 200 according to an embodiment of the present disclosure. The film forming apparatus 200 includes a container 209. The container 209 has a lower container 201, an exhaust duct 202, a support structure 210, and a shower head 230.

The lower container 201 is made of a metal such as aluminum. The exhaust duct 202 is provided on the upper peripheral edge of the lower container 201. In addition, an annular insulating member 204 is disposed on the exhaust duct 202. The shower head 230 is provided above the lower container 201 and is supported by the insulating member 204. A support structure 210 on which the substrate W is placed is provided substantially in the center of the lower container 201. Hereinbelow, the space in the container 209 surrounded by the lower container 201, the exhaust duct 202, the support structure 210, and the shower head 230 is defined as a processing space $S_P$.

In addition, an opening 205 is formed in the side wall of the lower container 201 so that carry-in/out of a substrate W is performed therethrough. The opening 205 is opened and closed by a gate valve G. The exhaust duct 202 has a hollow square shape in vertical cross section, and extends in an annular shape along the upper peripheral edge of the lower container 201. The space inside the exhaust duct 202 is defined as an exhaust space $S_E$. In the exhaust duct 202, a slit-shaped exhaust port 203 is formed in the extension direction of the exhaust duct 202. The exhaust port 203 is disposed outside a substrate W region along the peripheral edge of the substrate W placed on the support structure 210, and exhausts the gas in the processing space $S_P$.

In the exhaust duct 202, the side wall on the processing space $S_P$ side where the exhaust port 203 is formed is an example of an exhaust shield. In the present embodiment, the pressure in the exhaust space $S_E$ is maintained to be lower than the pressure in the processing space $S_P$ by the exhaust shield. In the present embodiment, the pressure in the processing space $S_P$ is maintained at a pressure higher than that in the exhaust space $S_E$ by 1 Torr or higher by the exhaust shield. For example, the pressure in the processing space $S_P$ is maintained at a pressure of, for example, 1 Torr or higher, and the pressure in the exhaust space $S_E$ is maintained at a pressure of, for example, 0.1 Torr or lower.

One end of an exhaust pipe 206 is connected to the exhaust duct 202. The other end of the exhaust pipe 206 is connected to an exhaust apparatus 208 having a vacuum pump or the like via a pressure adjustment valve 207 such as an auto pressure controller (APC) valve. The pressure adjustment valve 207 is controlled by the controller 100, and controls the pressure inside the processing space $S_P$ to a preset pressure.

A heater 250a is installed on the side surface of the exhaust duct 202 and the top surface of the shower head 230, and a heater 250b is embedded in the upper portion of the lower container 201. The heater 250a heats the exhaust duct 202 and the shower head 230 to, for example, 200 degrees C. Further, the heater 250b heats the top surface of the lower container 201 to, for example, 200 degrees C. This makes it possible to suppress the adhesion of a reaction by-product (so-called deposits) to the shower head 230, the exhaust duct 202, and the lower container 201. The exhaust pipe 206, the pressure adjusting valve 207, and the exhaust device 208 are also heated to, for example, 150 degrees C. by a heater (not shown) in order to suppress adhesion of deposits.

The support structure 210 includes a stage 211 and a support 212. The stage 211 is made of a metal such as aluminum, and a substrate W is placed on the top surface thereof. The support 212 is formed of a metal such as aluminum in a tubular shape, and supports the stage 211 from below.

A stage heater 214 is embedded in the stage 211. The stage heater 214 heats the substrate W placed on the stage 211 according to the power supplied thereto. The power supplied to the stage heater 214 is controlled by the controller 100. The stage heater 214 is an example of a heater.

A flow path 215 through which a coolant flows is formed in the stage 211. A chiller unit (not illustrated) is connected to the flow path 215 via a pipe 216a and a pipe 216b. A coolant adjusted to a predetermined temperature by the chiller unit is supplied to the flow path 215 via the pipe 216a, and the coolant circulating in the flow path 215 is returned to the chiller unit via the pipe 216b. The stage 211 is cooled by the coolant circulating in the flow path 215. The chiller unit is controlled by the controller 100.

The support 212 is arranged within the lower container 201 so as to penetrate an opening formed in the bottom portion of the lower container 201. The support 212 is raised and lowered through the driving of a lifting mechanism 240. When a substrate W is carried in, the gate valve G is opened, the support structure 210 is lowered through the driving of the lifting mechanism 240, and the substrate W is placed on the stage 211 through the opening 205. Then, the gate valve G is closed, the support structure 210 is raised through the driving of the lifting mechanism 240, and the film forming process is performed on the substrate W. In addition, when the substrate W is carried out, the support structure 210 is lowered by driving the lifting mechanism 240, the gate valve G is opened, and the substrate W is carried out from above the stage 211 through the opening 205.

The shower head 230 has a diffusion chamber 231a and a diffusion chamber 231b. The diffusion chamber 231a and the diffusion chamber 231b do not communicate with each other. A gas supply 220 is connected to each of the diffusion chamber 231a and the diffusion chamber 231b. Specifically, a valve 224a, a mass flow controller (MFC) 223a, a vaporizer 222a, and a raw-material supply source 221a are connected to the diffusion chamber 231a via a pipe 225a. The raw-material supply source 221a is, for example, a source of isocyanate. The vaporizer 222a vaporizes isocyanate liquid supplied from the raw-material supply source 221a. The MFC 223a controls the flow rate of isocyanate vapor vaporized by the vaporizer 222a. The valve 224a controls supply and stop of supply of the isocyanate vapor to the pipe 225a.

A valve 224b, an MFC 223b, a vaporizer 222b, and a raw-material supply source 221b are connected to the gas diffusion chamber 231b via a pipe 225b. The raw-material supply source 221b is, for example, a source of amine. The vaporizer 222b vaporizes amine liquid supplied from the raw-material supply source 221b. The MFC 223b controls the flow rate of the amine vapor vaporized by the vaporizer 222b. The valve 224b controls supply and stop of supply of amine vapor to the pipe 225b.

The diffusion chamber 231a communicates with the processing space $S_P$ via a plurality of ejection ports 232a, and the diffusion chamber 231b communicates with the processing space $S_P$ via a plurality of ejection ports 232b. The isocyanate vapor supplied into the diffusion chamber 231a via the pipe 225a diffuses in the diffusion chamber 231a and is ejected into the processing space $S_P$ in the form of a shower through the ejection ports 232a. The amine vapor supplied into the diffusion chamber 231b via the pipe 225b diffuses in the diffusion chamber 231b, and is ejected into the processing space $S_P$ in the form of a shower through the ejection ports 232b. After being ejected into the processing space $S_P$ through the ejection ports 232a and the ejection ports 232b, the isocyanate vapor and the amine vapor are mixed in the processing space $S_P$ and form a polyurea film on the surface of the substrate W placed on the stage 211.

[Plasma Processing Apparatus 300]

Figure 3:
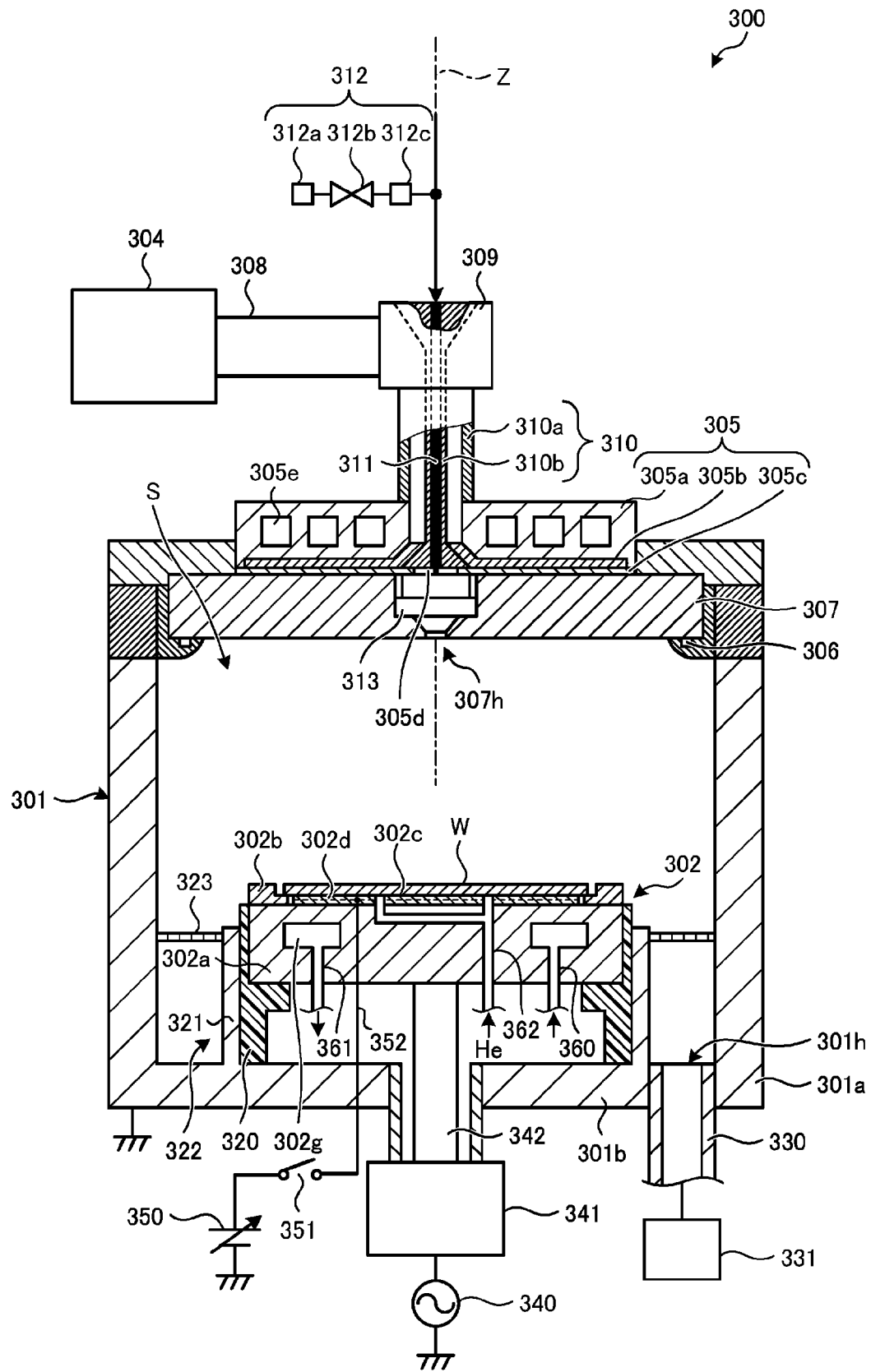
FIG. 3 is a schematic view illustrating an exemplary plasma processing apparatus according to an embodiment of the present disclosure.

FIG. 3 is a schematic view illustrating an exemplary plasma processing apparatus 300 according to an embodiment of the present disclosure. The plasma processing apparatus 300 includes a processing container 301 and a microwave output device 304.

The processing container 301 is formed in a substantially cylindrical shape using, for example, aluminum having an anodized surface, and provides a substantially cylindrical processing space S therein. The processing container 301 is grounded for safety. The processing container 301 has a side wall 301a and a bottom portion 301b. The central axis of the side wall 301a is defined as an axis Z. The bottom portion 301b is provided on the lower end side of the side wall 301a. The bottom portion 301b is provided with an exhaust port 301h for exhausting gas. The upper end of the side wall 301a is open.

A dielectric window 307 is provided in the upper end of the side wall 301a, and the opening at the upper end of the side wall 301a is closed from above by the dielectric window 307. The bottom surface of the dielectric window 307 faces the processing space S. An O-ring 306 is disposed between the dielectric window 307 and the upper end of the side wall 301a.

A stage 302 is provided in the processing container 301. The stage 302 is provided so as to face the dielectric window 307 in the direction of the axis Z. The space between the stage 302 and the dielectric window 307 is the processing space S. A substrate W is placed on the stage 302.

The stage 302 has a base 302a and an electrostatic chuck 302c. The base 302a is formed of a conductive material such as aluminum in a substantially disk-like shape. The base 302a is disposed in the processing container 301 such that the central axis of the base 302a substantially coincides with the axis Z.

The base 302a is formed of a conductive material and is supported by a tubular support 320 extending in a direction following the axis Z. A conductive tubular support 321 is provided around the outer circumference of the tubular support 320. The tubular support 321 extends from the bottom portion 301b of the processing container 301 towards the dielectric window 307 along the outer circumference of the tubular support 320. An annular exhaust path 322 is formed between the tubular support 321 and the side wall 301a.

An annular baffle plate 323, in which multiple through holes are formed in the thickness direction thereof, is provided in the upper portion of the exhaust path 322. The exhaust port 301h described above is provided below the baffle plate 323. An exhaust apparatus 331 including, for example, a vacuum pump, such as a turbo molecular pump, and an automatic pressure control valve, is connected to the exhaust port 301h via an exhaust pipe 330. The exhaust apparatus 331 is capable of reducing the pressure in the processing space S to a predetermined degree of vacuum.

The base 302a also functions as a high-frequency electrode. An RF power supply 340 configured to output an RF signal for RF bias is electrically connected to the base 302a to via a feeding rod 342 and a matching unit 341. The RF power supply 340 supplies, to the base 302a, bias power having a predetermined frequency (e.g., 13.56 MHz) suitable for controlling the energy of ions drawn into the substrate W via the matching unit 341 and the feeding rod 342.

The matching unit 341 accommodates a matcher for mainly matching the impedance on the RF power supply 340 side with the impedance on the load side, such as an electrode, plasma, and the processing container 301. A blocking capacitor for self-bias generation is included in the matcher.

An electrostatic chuck 302c is provided on the top surface of the base 302a. The electrostatic chuck 302c attracts and holds the substrate W using electrostatic force. The electrostatic chuck 302c has a substantially disk-like shape, and includes a heater 302d embedded therein. A heater power supply 350 is electrically connected to the heater 302d via a wire 352 and a switch 351. The heater 302d heats the substrate W placed on the electrostatic chuck 302c using the power supplied from the heater power supply 350. An edge ring 302b is provided on the base 302a. The edge ring 302b is disposed so as to surround the substrate W and the electrostatic chuck 302c. The edge ring 302b may also be called a focus ring.

A flow path 302g is provided inside the base 302a. A coolant is supplied to the flow path 302g from a chiller unit (not illustrated) through a pipe 360. The coolant supplied into the flow path 302g is returned to the chiller unit through a pipe 361. The temperature of the base 302a is controlled by circulating the coolant, the temperature of which is controlled by the chiller unit, in the flow path 302g in the base 302a. The temperature of the substrate W on the electrostatic chuck 302c is controlled by the coolant flowing in the base 302a and the heater 302d in the electrostatic chuck 302c. In the present embodiment, the temperature of the substrate W is controlled to 200 degrees C. or lower (e.g., 150 degrees C.).

In addition, the stage 302 is provided with a pipe 362 for supplying a heat transfer gas, such as He gas, between the electrostatic chuck 302c and the substrate W.

The microwave output device 304 outputs microwaves for exciting the processing gas supplied into the processing container 301. The microwave output device 304 generates microwaves having, for example, a frequency of 2.4 GHz.

The microwave output device 304 is connected to a mode converter 309 via a waveguide 308. The mode converter 309 converts the mode of the microwaves output from the microwave output device 304, and supplies the mode-converted microwaves to an antenna 305 through a coaxial waveguide 310.

The coaxial waveguide 310 includes an outer conductor 310a and an inner conductor 310b. The outer conductor 310a and the inner conductor 310b have a substantially cylindrical shape, and are disposed above the antenna 305 such that the central axes of the outer conductor 310a and the inner conductor 310b substantially coincide with the axis Z.

The antenna 305 includes a cooling jacket 305a, a dielectric plate 305b, and a slot plate 305c. The slot plate 305c is formed of a conductive metal in a substantially disk-like shape. The slot plate 305c is provided on the top surface of the dielectric window 307 such that the central axis of the slot plate 305c coincides with the axis Z. Multiple slot holes are formed in the slot plate 305c. The multiple slot holes are arranged in pairs around the central axis of the slot plate 305c.

The dielectric plate 305b is formed of a dielectric material, such as quartz, in a substantially disk-like shape. The dielectric plate 305b is disposed on the slot plate 305c such that the central axis of the dielectric plate 305b substantially coincides with the axis Z. The cooling jacket 305a is provided on the dielectric plate 305b.

The cooling jacket 305a is formed of a material having a conductive surface, and includes a flow path 305e formed therein. A coolant is supplied into the flow path 305e from a chiller unit (not illustrated). The lower end of the outer conductor 310a is electrically connected to the upper surface of the cooling jacket 305a. In addition, the lower end of the inner conductor 310b is electrically connected to the slot plate 305c through openings formed in the central portion of the cooling jacket 305a and the dielectric plate 305b.

The microwaves propagating in the coaxial waveguide 310 propagate in the dielectric plate 305b and propagate to the dielectric window 307 from the multiple slot holes in the slot plate 305c. The microwaves propagating in the dielectric window 307 are radiated into the processing space S from the bottom surface of the dielectric window 307.

A gas pipe 311 is provided inside the inner conductor 310b of the coaxial waveguide 310. A through hole 305d through which the gas pipe 311 is capable of passing is formed in the central portion of the slot plate 305c. The gas pipe 311 extends through the inside of the inner conductor 310b, and is connected to the gas supply 312.

The gas supply 312 supplies, to the gas pipe 311, a processing gas for laminating a sealing film on the substrate W. The gas supply 312 includes a gas supply source 312a, a valve 312*b*, and a flow controller 312*c*. The gas supply source 312*a* is a supply source of a processing gas for forming a sealing film. The processing gas includes a nitrogen-containing gas, a silicon-containing gas, and a rare gas. In the present embodiment, the nitrogen-containing gas is, for example, $NH_3$ gas or $N_2$ gas, the silicon-containing gas is, for example, $SiH_4$ gas, and the rare gas is, for example, He gas or Ar gas.

The valve 312*b* controls supply and stop of the processing gas from the gas supply source 312*a*. The flow controller 312*c* is, for example, a mass flow controller, and controls the flow rate of the processing gas from the gas supply source 312*a*.

An injector 313 is provided in the dielectric window 307. The injector 313 injects the processing gas supplied through the gas pipe 311 into the processing space S through a through hole 307*h* formed in the dielectric window 307. The processing gas injected into the processing space S is excited by microwaves radiated into the processing space S through the dielectric window 307. As a result, the processing gas is plasmatized in the processing space S, and a sealing film is laminated on the substrate W by, for example, ions and radicals contained in the plasma. In the present embodiment, the sealing film is, for example, a silicon nitride film.

[Configuration of Heating Apparatus 400]

Figure 4:
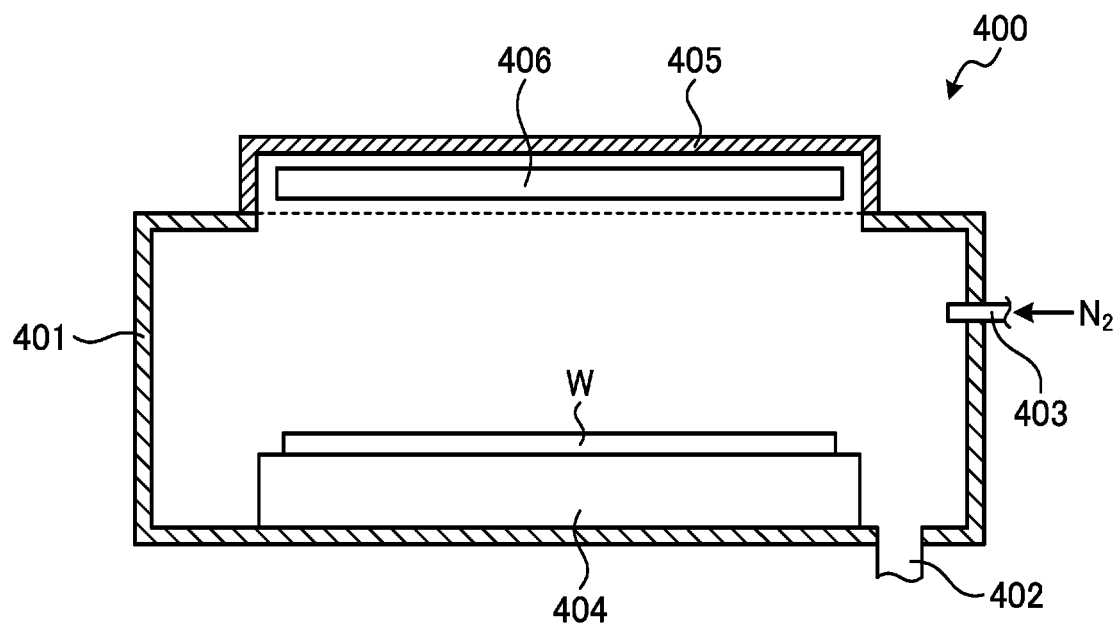
FIG. 4 is a schematic view illustrating an exemplary heating apparatus according to an embodiment of the present disclosure.

FIG. 4 is a schematic view illustrating an exemplary heating apparatus 400 according to an embodiment of the present disclosure. The heating apparatus 400 includes a container 401, an exhaust pipe 402, a supply pipe 403, a placement stage 404, a lamp house 405, and an infrared lamp 406.

The placement stage 404 on which a substrate W is placed is provided in the container 401. A lamp house 405 is provided at a position facing the surface of the placement stage 404 on which the substrate W is placed. The infrared lamp 406 is disposed in the lamp house 405.

An inert gas is supplied into the container 401 through a supply pipe 403. In the present embodiment, the inert gas is, for example, $N_2$ gas.

The inert gas is supplied into the container 401 through the supply tube 403 in the state in which the substrate W is placed on the placement stage 404. Then, the substrate W having an organic material laminated in the recess is heated to a temperature higher than, for example, 280 degrees C., by turning on the infrared lamp 406. In the present embodiment, the substrate W is heated to, for example, 500 degrees C. When the polyurea film laminated in the recess in the substrate W reaches a temperature higher than 280 degrees C., the polyurea film is depolymerized into isocyanate and amine. Then, the depolymerized isocyanate and amine gases are desorbed from the recess through the sealing film.

[Method of Forming Air Gap]

Figure 5:
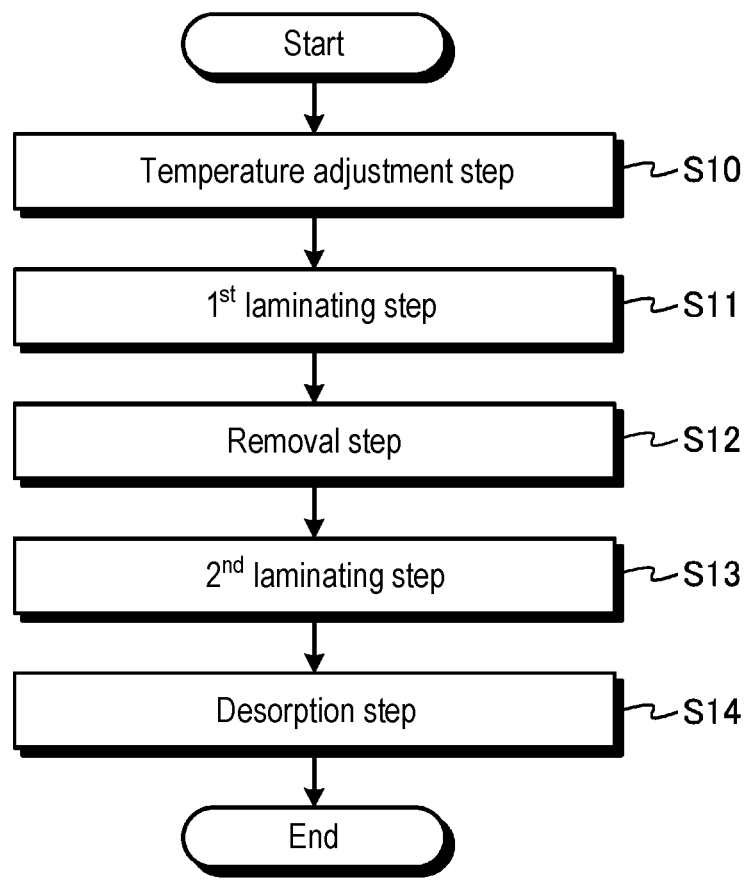
FIG. 5 is a flowchart illustrating an exemplary method of manufacturing a semiconductor device.
Figure 6:
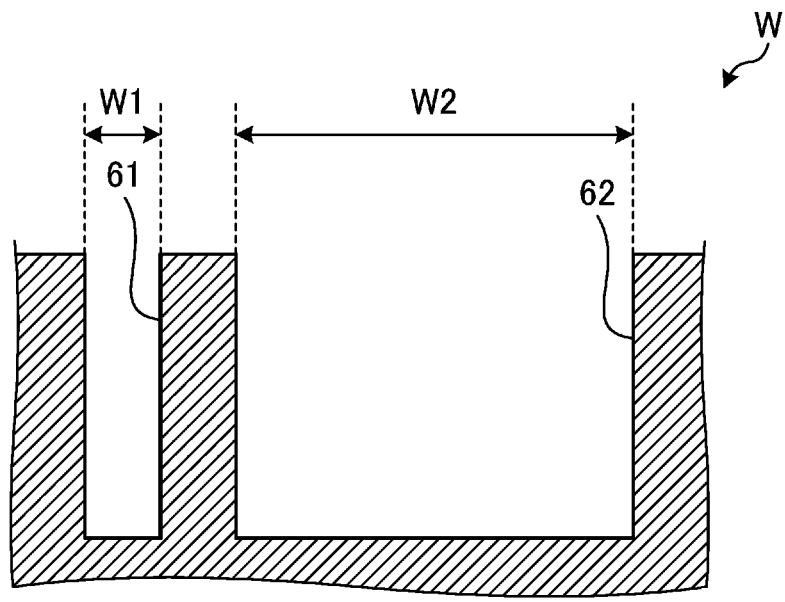
FIG. 6 is a schematic view illustrating an exemplary process of manufacturing a semiconductor device.

FIG. 5 is a flowchart illustrating an exemplary method of manufacturing a semiconductor device. For example, when a substrate W in which a recess 61 and a recess 62 having different widths are formed, for example, as illustrated in FIG. 6, is carried into the film forming apparatus 200 by the transport mechanism 106, the process illustrated in FIG. 5 is initiated. In the example of FIG. 6, the width W2 of the recess 62 is wider than the width W1 of the recess 61.

First, the film forming apparatus 200 executes a temperature adjustment step (S10). In step S10, the temperature of the substrate W placed on the stage 211 is adjusted to a temperature in a range of 200 degrees C. or higher and 280 degrees C. or lower (e.g., 250 degrees C.) by the stage heater 214 in the stage 211 and the coolant flowing in the flow path 215 in the stage 211.

Figure 7:
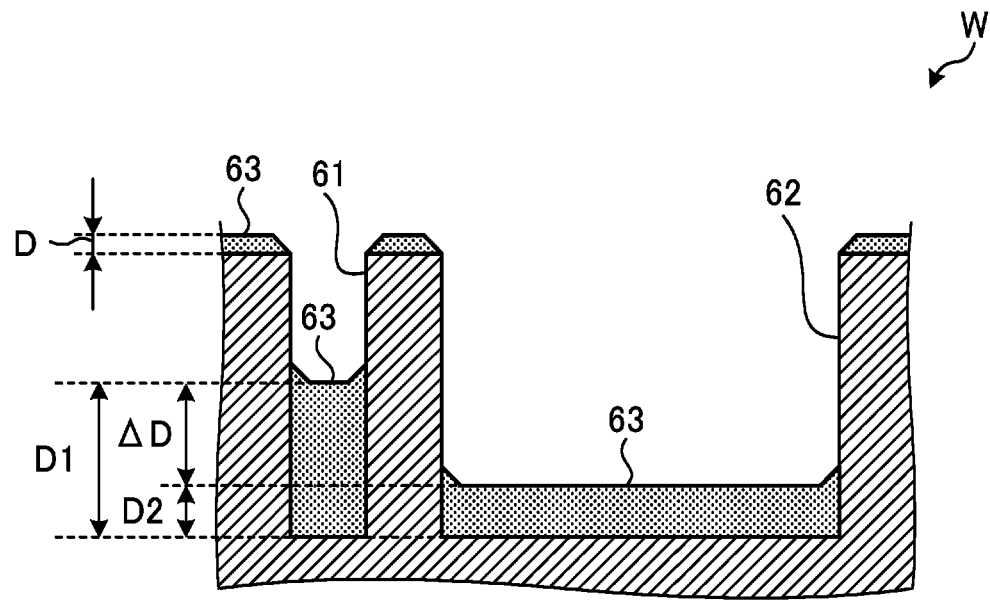
FIG. 7 is a view illustrating an exemplary process of manufacturing a semiconductor device.

Next, the film forming apparatus 200 executes a first laminating step (S11). In step S11, isocyanate gas and amine gas are supplied into the processing space $S_P$. As a result, a polyurea film 63 is laminated on the substrate W. In the range of 200 degrees C. or higher and 280 degrees C. or lower, polymerization and depolymerization coexist in polyurea, and thus the polyurea film 63 has fluidity. Therefore, a polyurea film 63 adhering to the side walls of the recesses 61 flows into the bottom of the recess 61, and a polyurea film 63 adhering to the side walls of the recess 62 flows into the bottom of the recess 62. For example, when a polyurea film 63 having a thickness D is laminated on the surface of the substrate W, for example, as illustrated in FIG. 7, a polyurea film having a thickness D1 greater than the thickness D is laminated on the bottom of the recess 61, and a polyurea film 63 having a thickness D2 greater than the thickness D is laminated on the bottom of the recess 62.

Here, in the present embodiment, the thickness D of the polyurea film 63 laminated on the substrate W in step S11 is ¼ or less of the width W2 of the recess 62, which is wider than the recess 61. In addition, the ratio of the area of the side walls of the recess 61 to the volume of the recess 61 is different from the ratio of the area of the side walls of the recess 62 to the volume of the recess 62. In the example of FIG. 7, the ratio of the area of the side walls of the recess 61 to the volume of the recess 61 is smaller than the ratio of the area of the side walls of the recess 62 to the volume of the recess 62. Therefore, the thickness D1 of the polyurea film 63 flowing from the side walls of the recess 61 into the bottom of the recess 61 is greater than the thickness D2 of the polyurea film 63 flowing from the side walls of the recess 62 into the bottom of the recess 62. In the example of FIG. 7, the difference between the thickness D1 and the thickness D2 is ΔD. For example, as illustrated in FIG. 7, a polyurea film 63 having a thickness D remains on the substrate W around the recess 61 and the recess 62.

Figure 8:
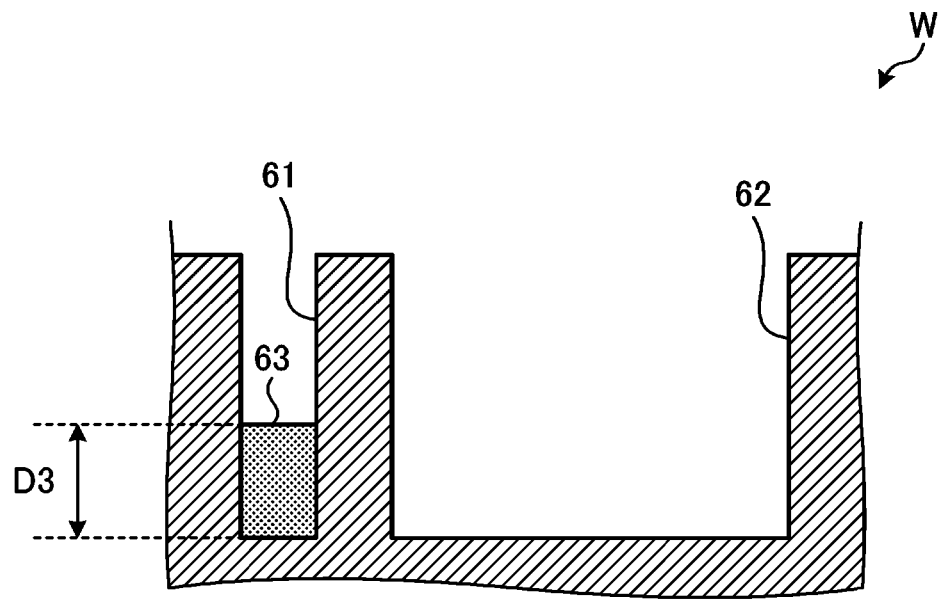
FIG. 8 is a view illustrating an exemplary process of manufacturing a semiconductor device.

Next, the film forming apparatus 200 executes a removal step (S12). In step S12, the supply of the gas into the processing space $S_P$ is stopped in the state in which the substrate W placed on the stage 211 is maintained at a temperature within the range of 200 degrees C. or higher and 280 degrees C. or lower (e.g., 250 degrees C.). As a result, the polyurea film 63 from the top surface thereof to a depth corresponding to the temperature of the substrate W and heating time of the substrate W is thermally decomposed and desorbed from the substrate W. In the present embodiment, the temperature and heating time of the substrate W are adjusted such that the polyurea film 63 having the thickness of D2 or more is thermally decomposed. As a result, for example, as illustrated in FIG. 8, the polyurea film 63 which has flowed into the bottom of the recess 62 and the polyurea film 63 which has remained on the substrate W around the recess 61 and the recess 62 are removed. Even in the recess 61, since some of the polyurea film 63, which has flowed into the bottom of the recess 61 and has the thickness D1, is thermally decomposed, the polyurea film 63 having a thickness D3 smaller than the thickness D1 remains on the bottom of the recess 61. Then, the substrate W is carried out from the film forming apparatus 200 by the transport mechanism 106, and is carried into the plasma processing apparatus 300.

Figure 9:
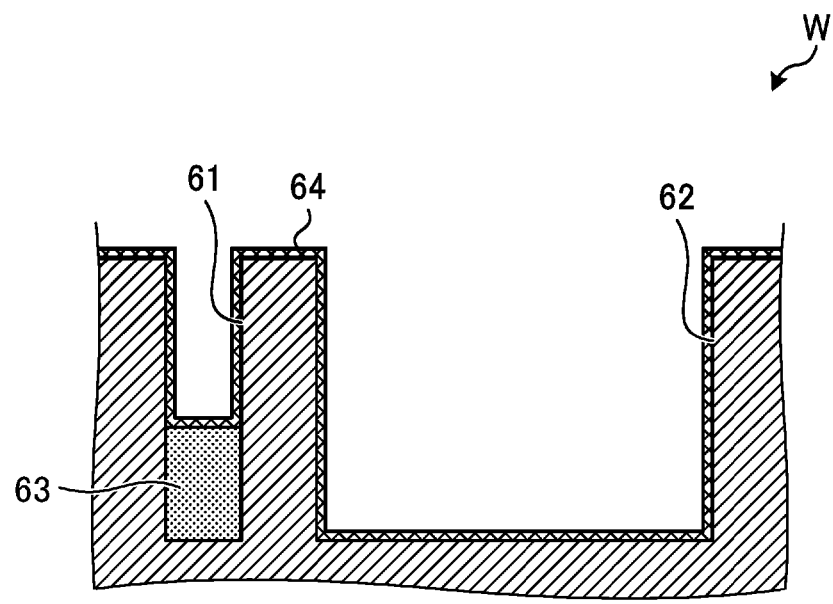
FIG. 9 is a view illustrating an exemplary process of manufacturing a semiconductor device.

Next, the plasma processing apparatus 300 executes a second laminating step (S13). In step S13, a sealing film is laminated on the substrate W using microwave plasma. As a result, for example, as illustrated in FIG. 9, a sealing film 64 is laminated on the polyurea film 63 in the recess 61 in the substrate W. Then, the substrate W is carried out from the plasma processing apparatus 300 and is carried into the heating apparatus 400 by the transport mechanism 106.

Figure 10:
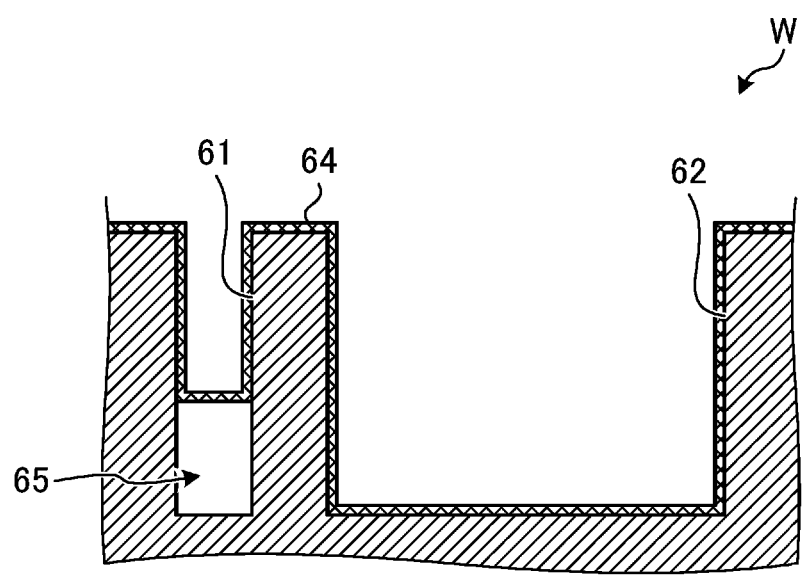
FIG. 10 is a view illustrating an exemplary process of manufacturing a semiconductor device.

Next, the heating apparatus 400 executes a desorption step (S14). In step S14, the substrate W is heated to a temperature of, for example, 300 degrees C. or higher (e.g., 500 degrees C.), by the heating apparatus 400. This causes the polyurea film 63 under the sealing film 64 to be thermally decomposed and desorbed through the sealing film 64. As a result, as illustrated in FIG. 10, for example, in the recess 61, an air gap 65 corresponding to the shape of the polyurea film 63 is formed under the sealing film 64. Then, the substrate W is carried out from the heating apparatus 400 by the transport mechanism 106, and the process illustrated in this flowchart is terminated.

[Relationship Between Temperature, Pressure, and D/R]

Figure 11:
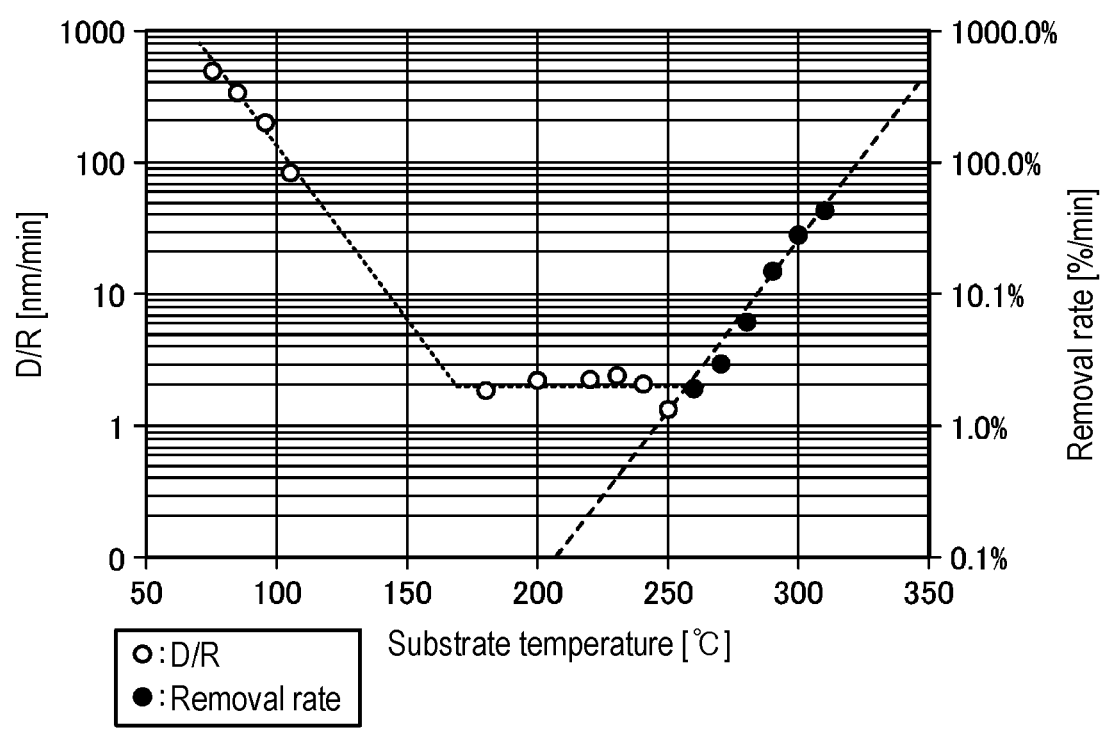
FIG. 11 is a diagram showing an exemplary relationship between deposition rate (D/R) and removal rate with respect to the temperature of a substrate.

FIG. 11 is a diagram showing an exemplary relationship between deposition rate (D/R) and removal rate with respect to the temperature of a substrate W. In the test shown in FIG. 11, the partial pressure of each of the isocyanate gas and the amine gas is 0.1 Torr in the processing space $S_P$ of the film forming apparatus 200 in which a substrate W is accommodated. The removal rate is a percentage of the film thickness that decreases for 1 minute in a polyurea film 63 having a film thickness of 100 nm with respect to the temperature of the substrate W.

When a polyurea film 63 is laminated on a substrate W, for example, as shown by the dotted line in FIG. 11, the D/R of the polyurea film 63 tends to decrease as the temperature of the substrate W increases. In addition, when the temperature of the substrate W is 180 degrees C. or higher, the decrease in D/R of the polyurea film 63 gradually becomes gentle, and the decrease in D/R stops at about 2 nm/min.

Meanwhile, as the temperature of the substrate W increases, the removal rate of the polyurea film 63 tends to increase, for example, as shown by the broken line in FIG. 11. Looking at the tendency of the removal rate, the removal of the polyurea film 63 starts when the temperature of the substrate W is around 200 degrees C. That is, when the temperature of the substrate W is 220 degrees C. or higher, depolymerization starts in a portion of the polyurea film 63. Thus, it is considered that the polyurea film 63 is in the state of having fluidity.

Referring to FIG. 11, when the temperature of the substrate W is around 260 degrees C., the removal rate of the polyurea film 63 is about 2%/min, and when the initial film thickness is 100 nm, the amount of the polyurea film 63 removed per unit time is about 2 nm/min. When the temperature of the substrate W is around 260 degrees C., the D/R of the polyurea film 63 is about 2 nm/min. Therefore, when the temperature of the substrate W is higher than 260 degrees C., it is considered that the film thickness of the polyurea film 63 does not increase on the substrate W. Therefore, it is preferable to form the polyurea film 63 in the state in which the temperature of the substrate W is within the range of 220 degrees C. or higher and 260 degrees C. or lower.

The test of FIG. 11 was performed in the state in which each of the partial pressures of the isocyanate gas and the amine gas was 0.1 Torr. However, when the partial pressures of the isocyanate gas and the amine gas are high, the D/R tends to be high and the removal rate tends to be low. Therefore, when each of the partial pressures of the isocyanate gas and the amine gas is 1 Torr, it is considered that the removal rate of the polyurea film 63 is 2%/min or more even if the temperature of the substrate W is 280 degrees C.

Meanwhile, when the partial pressures of the isocyanate gas and the amine gas are low, the D/R tends to be low and the removal rate tends to be high. Therefore, when each of the partial pressures of the isocyanate gas and the amine gas reaches 0.01 Torr, it is considered that the fluidization of the polyurea film 63 starts even when the temperature of the substrate W is 200 degrees C.

Therefore, it is preferable to form the polyurea film 63 in the state in which the temperature of the substrate W is within the range of 200 degrees C. or higher and 280 degrees C. or lower. In addition, each of the partial pressures of the isocyanate gas and the amine gas is preferably within the range of 0.01 Torr or higher and 1 Torr or lower.

When the temperature of the substrate W is low, the fluidity of the polyurea film 63 is low. Thus, voids may remain in the polyurea film 63 in a narrow recess 61. When voids remain in the polyurea film 63, the height of the top surface of the polyurea film 63 varies depending on the size of the voids. As a result, the height of the sealing film 64 formed on the polyurea film 63 varies, and the size of the air gap 65 after the polyurea film 63 is removed varies. Therefore, in order to ensure voids are not generated in the polyurea film 63, the temperature of the substrate W is more preferably 220 degrees C. or higher.

When the temperature of the substrate W is around 280 degrees C., the removal rate is high. Thus, it takes time to form the polyurea film 63 having a predetermined film thickness. Therefore, from the viewpoint of improving throughput, the temperature of the substrate W is more preferably 250 degrees C. or lower. That is, it is more preferable to form the polyurea film 63 in the state in which the temperature of the substrate W is within the range of 220 degrees C. or higher and 250 degrees C. or lower.

In the foregoing, embodiments have been described. As described above, the method of manufacturing a semiconductor device in the present embodiment includes a temperature adjustment step and a first laminating step. In the temperature adjustment step, a substrate W, which has recesses formed therein and is accommodated in the container 209 of the film forming apparatus 200, is adjusted to a temperature within the range of 200 degrees C. or higher and 280 degrees C. or lower. In the first laminating step, the polyurea film 63 is laminated in the recesses of the substrate W by supplying isocyanate gas and amine gas into the container 209. This makes it possible to selectively laminate the polyurea film 63 in the recess 61 having a narrow width rather than in the recess 62 having a wide width.

In addition, the method of manufacturing a semiconductor device in the above-described embodiment includes a second laminating step and a desorption step. In the second laminating step, a sealing film 64 is laminated on the polyurea film 63 laminated in the recesses. In the desorption step, the temperature of the substrate W is adjusted to a temperature higher than 280 degrees C., so that the polyurea film 63 under the sealing film 64 is thermally decomposed and the polyurea film 63 under the sealing film 64 is desorbed through the sealing film 64. As a result, an air gap 65 is formed between the sealing film 64 and the recesses. This makes it possible to efficiently form an air gap 65 having a predetermined shape.

In the temperature adjustment step in the above-described embodiment, the temperature of the substrate W is adjusted to a temperature within the range of 220 degrees C. or higher and 250 degrees C. or lower. This makes it possible to efficiently form an air gap 65 having a predetermined shape.

In the first laminating step in the above-described embodiment, each of the partial pressures of the isocyanate gas and the amine gas is adjusted to a pressure within the range of 0.01 Torr or higher and 1 Torr or lower. This makes it possible to selectively laminate the polyurea film 63 in the recess 61 having a narrow width rather than in the recess 62 having a wide width.

The film forming apparatus in the above-described embodiment includes a container 209, a gas supply 220, a stage heater 214, and a controller 100. A substrate W having recesses formed therein is accommodated in the container 209. The gas supply 220 supplies isocyanate gas and amine gas into the container 209. The stage heater 214 heats the substrate W. The controller 100 executes the temperature adjustment step and the laminating step. The controller 100 controls the stage heater 214 such that the temperature of the substrate W accommodated in the container 209 is adjusted to a temperature within the range of 200 degrees C. or higher and 280 degrees C. or lower in the temperature adjustment step. In the laminating step, the controller 100 laminates the polyurea film 63 in the recesses in the substrate W by controlling the gas supply 220 such that isocyanate gas and amine gas are supplied into the container 209. This makes it possible to selectively laminate the polyurea film 63 in the recess 61 having a narrow width rather than in the recess 62 having a wide width.

The film forming apparatus 200 in the above-described embodiment includes an exhaust duct 202 configured to exhaust the gas in the container 209, and an exhaust shield provided between a processing space $S_P$, which is a space in the container 209 to which the substrate W is exposed, and an exhaust space $S_E$, which is a space in the gas supply 220. The exhaust shield maintains the pressure in the exhaust space $S_E$ to be lower than the pressure in the processing space $S_P$. For example, the exhaust shield maintains the pressure in the processing space $S_P$ at a pressure higher than the pressure in the exhaust space $S_E$ by 1 Torr or higher. This makes it possible to suppress adhesion of deposits to the side wall of the gas supply 220.

[Others]

The technique disclosed in the present application is not limited to the above-described embodiments, and various modifications are possible within the scope of the gist thereof.

For example, in the above-described embodiment, the pressure in the processing space $S_P$ is the same in the first laminating step and the removal step. However, as long as the pressure in the processing space $S_P$ is included within the range of 0.01 Torr to 1 Torr, the pressure in the processing space $S_P$ may be different between the first laminating step and the removal step. For example, when the pressure in the processing space $S_P$ is included within the range of 0.01 Torr to 1 Torr, the pressure in the processing space $S_P$ in the first laminating step may be slightly higher than that in the processing space $S_P$ in the removal step. In this case, it is possible to increase the D/R in the first laminating step and to increase the removal rate in the removal step. Thus, it is possible to shorten the processing time.

In addition, in the above-described embodiment, the manufacturing system 10 includes a film forming apparatus 200-1, a film forming apparatus 200-2, a plasma processing apparatus 300, and a heating apparatus 400, but the technique disclosed herein is not limited thereto. At least one of the film forming apparatus 200, the plasma processing apparatus 300, and the heating apparatus 400 may be provided plurally in the manufacturing system 10. In particular, it is preferable to provide the manufacturing system 10 with a large number of apparatuses that take more time to perform processing than other apparatuses. This makes it possible to reduce processing bottlenecks.

In the above-described embodiment, a polyurea film having a urea bond is used as an exemplary polymer film, but a polymer having a bond other than the urea bond may be used as the polymer film. The polymer having a bond other than the urea bond may be, for example, polyurethane having a urethane bond. Polyurethane may be synthesized, for example, by copolymerizing a monomer having an alcohol group and a monomer having an isocyanate group. In addition, the polyurethane is depolymerized into a monomer having an alcohol group and a monomer having an isocyanate group by being heated to a predetermined temperature.

It shall be understood that the embodiments disclosed herein are illustrative and are not restrictive in all aspects. Indeed, the above-described embodiments can be implemented in various forms. The embodiments described above may be omitted, replaced, or modified in various forms without departing from the scope and spirit of the appended claims.

According to the various aspects and embodiments of the present disclosure, it is possible to selectively form a film in a recess having a narrow width rather than in a recess having a wide width.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor, the method comprising:
    adjusting a temperature of a substrate having recesses formed therein and accommodated in a container to a temperature within a first temperature range of 220 degrees C. or higher and 280 degrees or lower, the recesses including a first recess with a width and a second recess with a width wider than the width of the first recess;
    laminating polyurea films in the first recess and the second recess in the substrate at the temperature within the first temperature range by supplying isocyanate gas and amine gas into the container;
    removing the polyurea films by stopping supplying the isocyanate gas and the amine gas while maintaining the substrate at the temperature within the first temperature range, the removing the polyurea films being performed such that the polyurea film laminated in the second recess is thermally decomposed;
    laminating a sealing film on the substrate; and
    desorbing the polyurea film in the first recess by heating the substrate to a temperature within a second temperature range, to form an air gap in the first recess.

2. The method of claim 1,
    wherein the temperature of the desorbing the polyurea film is a temperature higher than 280 degrees C.

3. The method of claim 2, wherein, in the adjusting the temperature of the substrate, the temperature of the substrate is adjusted to a temperature within a range of 220 degrees C. or higher and 250 degrees C. or lower.

4. The method of claim 3, wherein, in laminating the polyurea films, each of partial pressures of the isocyanate gas and the amine gas is adjusted to a pressure within a range of 0.01 Torr or higher and 1 Torr or lower.

5. The method of claim 1, wherein, in the adjusting the temperature of the substrate, the temperature of the substrate is adjusted to a temperature within a range of 220 degrees C. or higher and 250 degrees C. or lower.

6. The method of claim 1, wherein, in laminating the polyurea films, each of partial pressures of the isocyanate gas and the amine gas is adjusted to a pressure within a range of 0.01 Torr or higher and 1 Torr or lower.

7. A film forming apparatus comprising:
a container in which a substrate having a recess formed therein is accommodated;
a gas supply configured to supply isocyanate gas and amine gas into the container;
a heater configured to heat the substrate; and
a controller, wherein the controller is configured to execute:
controlling the heater to adjust a temperature of the substrate having recesses formed therein and accommodated in the container to a temperature within a first temperature range of 220 degrees C. or higher and 280 degrees or lower, the recesses including a first recess with a width and a second recess with a width wider than the width of the first recess;
laminating polyurea films in the first recess and the second recess in the substrate at the temperature within the first temperature range by controlling the gas supply to supply the isocyanate gas and the amine gas into the container;
removing the polyurea films by controlling the gas supply to stop supplying the isocyanate gas and the amine gas while maintaining the substrate at the temperature within the first temperature range, the removing the polyurea films being performed such that the polyurea film laminated in the second recess is thermally decomposed;
laminating a sealing film on the substrate by controlling the gas supply; and
desorbing the polyurea film in the first recess by controlling the heater to heat the substrate to a temperature within a second temperature range, to form an air gap in the first recess.

8. The film forming apparatus of claim 7, further comprising:
an exhaust duct configured to exhaust the gases in the container;
an exhaust shield provided between a processing space, which is a space in the container and to which the substrate is exposed, and an exhaust space, which is a space in the exhaust duct,
wherein the exhaust shield maintains a pressure in the exhaust space to be lower than the pressure in the processing space.

9. The film forming apparatus of claim 8, wherein the pressure in the processing space is maintained at a pressure higher than the pressure in the exhaust space by 1 Torr or higher by the exhaust shield.

* * * * *